United States Patent
Sharma et al.

(10) Patent No.: US 8,628,818 B1
(45) Date of Patent: Jan. 14, 2014

(54) CONDUCTIVE PATTERN FORMATION (75) Inventors: Sunity K. Sharma, Fremont, CA (US);
Francesco Fornasiero, Berkeley, CA (US); Jaspreet Singh Dhau, Menlo Park, CA (US)

(73) Assignee: SRI International, Menlo Park, CA (US)

( * ) Notice: Subject to any disclaimer, the term of this patent is extended or adjusted under 35 U.S.C. 154(b) by 750 days.

(21) Appl. No.: 12/142,577

(22) Filed: Jun. 19, 2008

Related U.S. Application Data (60) Provisional application No. 60/945,513, filed on Jun. 21, 2007.

(51) Int. Cl.
*H05K 3/10* (2006.01)
*H05K 3/38* (2006.01)
*H05K 3/02* (2006.01)

(52) U.S. Cl.
USPC .......... 427/97.3; 427/58; 427/96.1; 427/97.1; 427/98.4; 427/123; 427/125; 427/256; 427/258; 427/259; 427/261; 427/270; 427/271; 427/272; 427/282; 29/846; 29/829; 29/825; 29/592

(58) Field of Classification Search
USPC ...................................................... 427/98.4
See application file for complete search history.

(56) References Cited

U.S. PATENT DOCUMENTS

| | | |
|---|---|---|
| 3,793,072 A | 2/1974 | Lando |
| 3,930,963 A | 1/1976 | Polichette et al. |
| 3,937,857 A | 2/1976 | Brummett et al. |
| 3,969,554 A * | 7/1976 | Zeblisky ............. 427/97.2 |
| 4,451,666 A | 5/1984 | Sofranko et al. |
| 4,486,466 A | 12/1984 | Leech et al. |
| 4,715,935 A | 12/1987 | Lovie et al. |
| 4,873,123 A | 10/1989 | Canestaro et al. |
| 4,976,990 A | 12/1990 | Bach et al. |
| 5,021,398 A | 6/1991 | Sharma et al. |
| 5,179,060 A | 1/1993 | Subramanian et al. |
| 5,281,447 A | 1/1994 | Brady et al. |

(Continued)

FOREIGN PATENT DOCUMENTS

| | | | |
|---|---|---|---|
| GB | 1154152 | 6/1969 | |
| JP | 62-211935 | * 9/1987 | ............ 428/457 |
| JP | 9-64309 | 3/1997 | |
| WO | 96/27691 | 9/1996 | |

OTHER PUBLICATIONS

Gilleo, Handbook of Flexible Circuits, Springer, 1998, pp. 20-23.*

(Continued)

*Primary Examiner* — Michael Cleveland
*Assistant Examiner* — Lisha Jiang
(74) *Attorney, Agent, or Firm* — McDonnell Boehnen Hulbert & Berghoff LLP (57) ABSTRACT

A system and method for forming conductive lines on a substrate comprising depositing a precursor onto at least a portion of the substrate, depositing a thin layer of conductive material over the precursor, forming a negative-patterned mask over a portion of the thin layer of conductive material to form an exposed pattern, forming conductive lines in the exposed pattern, removing the patterned mask thereby uncovering an exposed portion of the conductive layer that substantially corresponds to the negative pattern portion, and removing the exposed portion of the conductive layer so as to uncover substrate that substantially corresponds to the exposed portion.

19 Claims, 5 Drawing Sheets

(56) References Cited

U.S. PATENT DOCUMENTS

| | | | |
|---|---|---|---|
| 5,332,646 | A | 7/1994 | Wright et al. |
| 5,464,692 | A * | 11/1995 | Huber ............................ 428/343 |
| 5,478,462 | A | 12/1995 | Walsh |
| 5,721,007 | A | 2/1998 | Lynch et al. |
| 5,846,615 | A | 12/1998 | Sharma et al. |
| 5,894,038 | A | 4/1999 | Sharma et al. |
| 5,980,998 | A * | 11/1999 | Sharma et al. ................ 427/559 |
| 6,165,912 | A * | 12/2000 | McConnell et al. .......... 438/758 |
| 6,174,353 | B1 | 1/2001 | Yuan et al. |
| 6,265,086 | B1 | 7/2001 | Harkness |
| 6,395,332 | B1 | 5/2002 | Hanawa et al. |
| 6,548,122 | B1 | 4/2003 | Sharma et al. |
| 6,663,915 | B2 | 12/2003 | Palmans et al. |
| 6,775,907 | B1 * | 8/2004 | Boyko et al. .................... 29/852 |
| 6,824,666 | B2 | 11/2004 | Gandikota et al. |
| 6,855,378 | B1 | 2/2005 | Narang |
| 6,911,385 | B1 | 6/2005 | Haubrich et al. |
| 6,972,078 | B1 | 12/2005 | Tsou et al. |
| 2002/0182308 | A1 | 12/2002 | Lee et al. |
| 2005/0176990 | A1 | 8/2005 | Coleman et al. |
| 2005/0238812 | A1 | 10/2005 | Bhangale et al. |

OTHER PUBLICATIONS

Stearns, Flexible Printed Circuitry, McGraw-Hill Professional, 1995, pp. 125-126.*

Office Action dated Jun. 19, 2009 from U.S. Appl. No. 11/854,274.
Office Action dated Dec. 14, 2009 from U.S. Appl. No. 11/854,277.
Final Office Action dated Jan. 7, 2010 from U.S. Appl. No. 11/854,274.
Final Office Action dated May 18, 2010 from U.S. Appl. No. 11/854,277.
Office Action dated Sep. 9, 2010 from U.S. Appl. No. 11/854,277.
Office Action dated Sep. 10, 2010 from U.S. Appl. No. 11/854,274.
Office Action dated Nov. 10, 2010 from U.S. Appl. No. 12/779,867.
Office Action dated Aug. 6, 2010 from U.S. Appl. No. 11/854,271.
Francis et al., Advanced Organic Chemistry: Part A, Springer, (2007).
U.S. Appl. No. 11/520,341, filed Sep. 12, 2006.
U.S. Appl. No. 11/854,271, filed Sep. 12, 2007.
U.S. Appl. No. 12/143,737, filed Jun. 20, 2008.
Office Action dated Nov. 15, 2010 from U.S. Appl. No. 12/143,737.
Final Office Action dated Jan. 4, 2011 from U.S. Appl. No. 11/854,277.
Final Office Action dated Jan. 7, 2011 from U.S. Appl. No. 11/854,271.
Notice of Allowance dated Mar. 9, 2011 from U.S. Appl. No. 11/854,274.
Notice of Allowance dated Mar. 21, 2011 from U.S. Appl. No. 12/143,737.
Final Office Action dated Feb. 10, 2011 from U.S. Appl. No. 12/779,867.

* cited by examiner

CONDUCTIVE PATTERN FORMATION

CROSS REFERENCE TO RELATED APPLICATIONS

This application claims priority to U.S. Provisional Application No. 60/945,513 filed on Jun. 21, 2007, entitled "SYSTEMS AND METHODS FOR CONDUCTIVE PATTERN FORMATION", which is incorporated herein by reference in its entirety and for all purposes.

FIELD OF THE INVENTION

The present disclosure relates generally to the manufacture of conductive lines. More particularly, the present disclosure relates to the manufacture of conductive lines using a predominately additive method.

BACKGROUND

Conventional fabrication of printed circuits use a subtractive method of fabrication whereby a blank and thick copper layer is first laid down on a substrate. The thickness of the copper layer is typically a thickness of the final conductive lines. To produce a desired copper pattern, subtractive processing uses a photolithography exposure and chemical etch to remove most of the copper that was laid down. The chemical etch materials and a large proportion of the removed copper from the circuit both represent waste, whose disposal increases the cost of the circuits made using this subtractive method and is environmentally unfriendly. Furthermore, the photolithography exposure and chemical etch processes are time consuming and expensive.

OVERVIEW

An apparatus, system, and method of conductive pattern formation are provided. In one embodiment, a method for forming conductive lines on a substrate comprises depositing a precursor onto at least a portion of the substrate, depositing a thin layer of conductive material over the precursor, forming a negative-patterned mask over a portion of the thin layer of conductive material to form an exposed pattern, forming conductive lines in the exposed pattern, removing the patterned mask thereby uncovering an exposed portion of the conductive layer that substantially corresponds to the negative pattern portion, and removing the exposed portion of the conductive layer so as to uncover substrate that substantially corresponds to the exposed portion.

In another embodiment, a structure may have a substrate, a precursor deposited over at least a portion of the substrate, a thin layer of conductive material disposed over the precursor, and a set of conductive lines disposed over the thin layer of conductive material.

In yet another embodiment, a system for printing a removable mask on a substrate may have a first printer for printing a precursor onto at least a portion of the substrate having a first reservoir configured to contain a precursor solution that includes: a solvent, a Lewis base ligand in the solvent, and a palladium carboxylate in the solvent. The first printer may also have a first dispensing mechanism configured to transfer the palladium precursor solution from the first reservoir to at least a portion of the substrate. The system may also have a deposit device to deposit a thin layer of conductive material on top of the precursor, and a second printer for printing a patterned mask over a negative pattern portion of the thin layer of conductive material, the second printer having: a second reservoir configured to contain a removable mask ink that includes: a solvent, wherein the solvent is recyclable and reusable, at least one rheological promoting additive. The second printer may also have a second dispensing mechanism configured to transfer the removable mask ink from the second reservoir over the thin layer of conductive material.

The present invention provides other hardware configured to perform the methods of the invention, as well as software stored in a machine-readable medium (e.g., a tangible storage medium) to control devices to perform these methods. These and other features will be presented in more detail in the following detailed description of the invention and the associated figures.

BRIEF DESCRIPTION OF THE DRAWINGS

The accompanying drawings, which are incorporated into and constitute a part of this specification, illustrate one or more example embodiments and, together with the description of example embodiments, serve to explain the principles and implementations.

In the drawings.

DESCRIPTION OF EXAMPLE EMBODIMENTS

Embodiments are described herein in the context of a conductive pattern formation. The following detailed description is illustrative only and is not intended to be in any way limiting. Other embodiments will readily suggest themselves to such skilled persons having the benefit of this disclosure. Reference will now be made in detail to implementations as illustrated in the accompanying drawings. The same reference indicators will be used throughout the drawings and the following detailed description to refer to the same or like parts.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

In accordance with the present invention, the components, process steps, and/or data structures may be implemented using various types of operating systems, computing platforms, computer programs, and/or general purpose machines. In addition, those of ordinary skill in the art will recognize that devices of a less general purpose nature, such as hard-wired devices, field programmable gate arrays (FPGAs), application specific integrated circuits (ASICs), or the like, may also be used without departing from the scope and spirit of the inventive concepts disclosed herein.

A predominately additive method and system for conductive line and pattern formation will be described herein. This system and method is well suited for, among other things, the manufacture of circuits. For example, in one application, conductive lines may be printed onto substrates such as flexible substrates and substrates with custom shapes.

Figure 1:
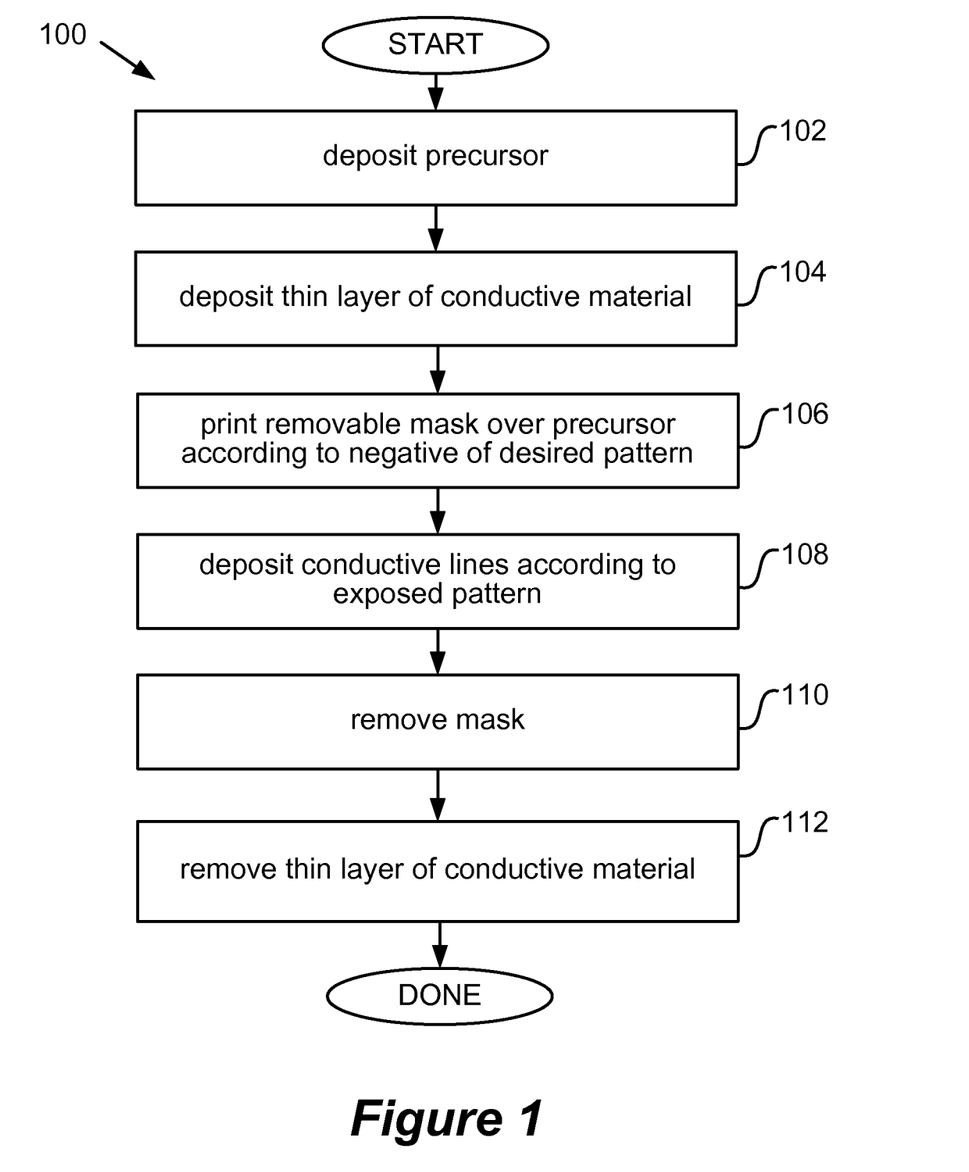
FIG. 1 is a flow diagram of a predominantly additive method.
Figure 2:
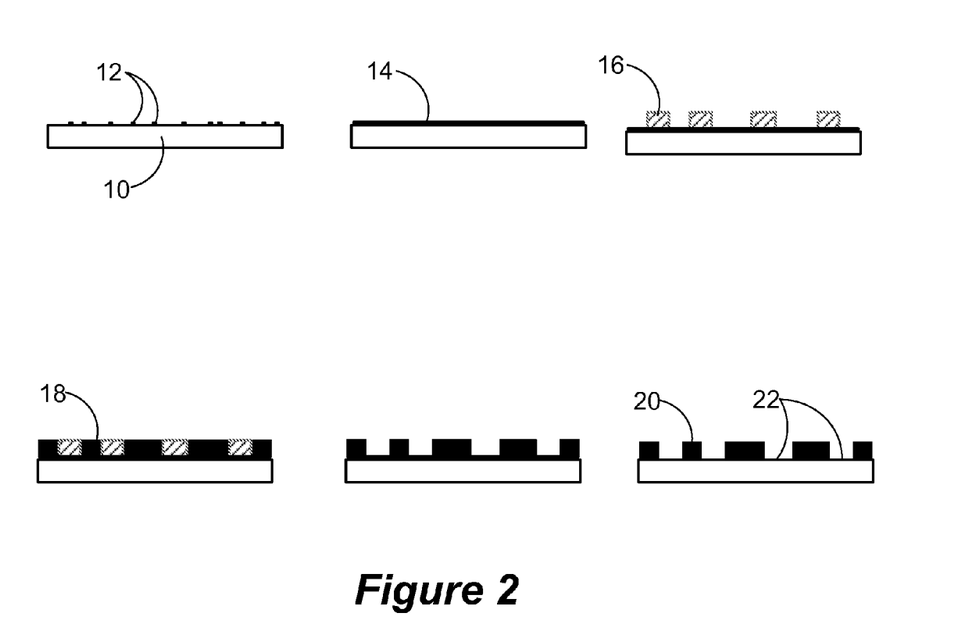
FIG. 2 illustrates a block diagram of the output at each step in the additive method of FIG. 1.

Reference will now be made to FIGS. 1 and 2. FIG. 1 is a flow diagram of a predominately additive method. FIG. 2 illustrates a block diagram of the output at each step in the additive method of FIG. 1. The additive method 100 begins by depositing a precursor 12 onto a substrate 10 (102 in FIG. 2). In one embodiment, the precursor 12 includes elemental and active palladium. Active palladium is a metal precursor that works well with many substrates and copper deposition techniques. The active palladium has two desirable properties: (1) it is catalytic for subsequent addition of a metal onto the palladium (such as electroless deposition), and (2) it is strongly anchored to the underlying substrate and to the metal deposited on it. The active palladium is disposed in minute amounts on the surface and does not form a conductive layer by itself, but facilitates subsequent deposition of a metal onto the surface, according to the pattern of the palladium, to form a conductive pattern. The conductive pattern may include one or more conductive lines, or a block deposition of metal according to other shapes that do not resemble lines.

This conductive pattern formation is well suited for use in circuit manufacture, and find wide use to create both existing and new products. For example, the present invention enables and eases printing of conductive lines onto flexible substrates and substrates with custom shapes.

In one embodiment, the active palladium approximately has a zero valance. The active palladium is also ideally disposed monoatomically onto the substrate. Elemental palladium does not readily bind to a surface monoatomically or with an approximately zero valance, and needs to be deliberately processed to achieve such a state.

The precursor 12 may be deposited as a solution. The precursor 12, or a precursor solution, may be delivered to a substrate in any of a number of different manners. In one embodiment, the precursor 12 is blank deposited, without a pattern onto the substrate 10 to deposit the precursor. In another embodiment, the precursor solution is delivered only to selective regions of the substrate according to a desired pattern. This spatial selectivity is referred to herein as "printing" the palladium precursor solution on the substrate. In other embodiments, the palladium precursor solution coats the entire substrate or a large portion thereof. This may be accomplished via a printer (where the entire surface is selected for printing), dip coating, or another blank printing procedure. In such cases, the blank palladium precursor solution may or may not be subsequently patterned to produce the pattern. When dispersed by a printer or automated printing process, the palladium precursor solution may be considered, and referred to herein, as an 'ink' or a 'palladium ink'.

In one embodiment, the palladium precursor solution includes a Lewis base ligand and a palladium compound in a solvent. A Lewis base ligand (nucleophile) and a palladium compound, such as palladium carboxylate, may be added to a solvent to create the palladium precursor solution. In a specific embodiment, palladium propionate was prepared by treating commercially available palladium acetate in excess propionic acid. The mixture was maintained at about 40° C. for about 24 hours followed by removal of excess propionic acid under a vacuum at room temperature. The resulting solid is soluble in amyl acetate. In another specific embodiment suitable for printing on polyester, a solution of palladium propionate having 0.05% palladium by weight was prepared in amyl acetate. Aniline was added in a stoichiometric amount that corresponds to 2 moles of aniline per gram atom of palladium. This clear solution was then suitable for printing.

The palladium precursor solution is exposed to conditions that promote evaporation of the solvent from the palladium precursor solution, to leave a palladium precursor on the substrate. Typically this includes supplying heat to the substrate and/or solution via conduction, convection and/or radiation, such as infra-red or ultraviolet radiation. For example, a field evaporation using convection is suitable for many printing applications. While the goal of this evaporation step is generally to remove as much as the solvent as possible, it is understood that incomplete solvent evaporation is suitable for many embodiments. In this case, additional heat or energy supplied in the next step may complete the evaporation process.

The radiation source may be coherent or non-coherent. Suitable energy sources may include thermal sources, light sources such as a laser, infrared and ultraviolet heaters, ion beams, e-beams, microwave sources, and combinations thereof. In one embodiment, electromagnetic radiation tuned to a particular wavelength is employed to minimize thermal energy transfer and emphasize chemical reaction. For example, ultraviolet radiation may be employed to promote many different chemical decomposition reactions. Further, microwave energy may be employed for palladium inks where the anion or ligand has hydroxyl groups, as the hydroxyl absorbs radiation in the microwave range.

Precursor printing may use a commercially available printing technique or apparatus. In other cases, a printing apparatus is specially manufactured and/or configured for printing a precursor solution. The printing apparatus may include a contact or contact-less printing technology, and/or signal-directed, manual or mechanical means. For example, the printing apparatus may employ any one, or a combination, of the following printing technologies: ink-jet printing, screen printing, pad-printing, spray coating, spin coating, puddle coating, dip coating, Gravure printing, ultrasonic spray techniques, wire coating, a stencil, rotogravure, flexographic techniques, brush coating, or various other blank coating techniques. Monochrome printing is suitable in many instances.

Various processes and printing apparatus for blanket depositing of precursor 12 may also be employed. A blanket deposition involves coating a large portion or the entire substrate 10 surface with the palladium ink and without defining a pattern. Dip coating represents one suitable method for blanket deposition of palladium ink. Dip coating allows substrates in any shape and size to have palladium precursor solution disposed thereon. For example, strands and fibers such as those later weaved together may be dip coated, in addition to non-flat surfaces.

In one embodiment, the printing apparatus permits conformal printing of the precursor 12. Conformal printing refers to printing precursor 12 on non-flat and three-dimensional surfaces. For example, the non-flat surface may include the inner surface of a cell phone housing or other portable electronics device, which is commonly curved and custom shaped. In one embodiment, conformal printing apparatus includes a pen, movable in three dimensions, that dispenses palladium ink in response to a control signal. Based on a known position of the controlled pen relative to the non-flat substrate, ink is released at controlled times and a pattern is then produced on the conformal surface as desired.

In one embodiment, the precursor is disposed on the surface by depositing a palladium precursor solution onto the substrate. A solvent in the solution is then evaporated away, before decomposing a palladium precursor (left after the evaporation) to produce active palladium on the substrate surface.

The solvent evaporation and decomposition typically add energy. Generally, this may use any combination of heat, an e-beam, an ion beam, a laser, ultra-violet rays, infra-red rays, or the like. The palladium precursor solution is exposed to conditions that promote evaporation of the solvent from the palladium precursor solution, to leave a palladium precursor on the substrate. This may include supplying heat to the substrate and/or solution via conduction, convection and/or radiation. A field evaporation using convection is suitable for many applications. In one embodiment, an evaporation apparatus receives the substrate and exposes the palladium precursor solution to conditions that promote evaporation of the solvent from the palladium precursor solution to leave the precursor on the substrate. In another embodiment, solvent evaporation is coupled with the decomposition process. In this case, evaporation apparatus is part of a larger apparatus that also performs decomposition of the palladium precursor. Spatial control for the decomposition is useful when a pattern has not already been established, for example, during blank deposition of the solution onto the substrate. In a specific embodiment, a guided laser, ion beam or e-beam, is employed to provide a pattern on the surface by locally decomposing the palladium precursor according to the beam movement.

Further description of active palladium suitable for use herein is provided in co-pending patent application Ser. No. 11/520,341, filed on Sep. 12, 2006, which is entitled 'FLEXIBLE CIRCUIT CHEMISTRY' and incorporated by reference in its entirety for all purposes. This patent application also describes suitable deposition and manufacturing techniques that are suitable for use herein.

Returning back to FIG. 1, method 100 proceeds with depositing a thin layer of conductive material 14 (104). Copper may be added to form conductive material 14. Other metals and metal alloys are also suitable for use. Typically, the metal deposits onto locations of substrate 10 covered by the precursor 12. Thickness for conductive layer 14 may vary. Typically, the thickness is less than the total conductive line thickness after step 108. In one embodiment, conductive layer 14 includes an average thickness less than about 4 micrometers. In a specific embodiment, conductive layer 14 includes an average thickness between about 0.025 and about 2 micrometers.

Plating is the general name of surface-covering techniques in which a metal is coated onto a solid surface. Numerous plating methods conventionally used today may benefit from active palladium. Such techniques include: vapor deposition under vacuum, sputtering, chemical vapor deposition with or without a vacuum, and other methods using vacuum or gas conditions. Thin film deposition plating techniques have accomplished plating on scales as small as the width of an atom.

Metallizing refers to the process of coating metal on nonmetallic objects. One metallizing technique deposits a metal on a seed layer of precursor 12 by electroless deposition (using a conventional electroless deposition process). Electroless plating, also known as chemical or auto-catalytic plating, is a non-galvanic type of plating method that involves several simultaneous reactions in an aqueous solution, which may occur without the use of external electrical power. The reaction is accomplished when hydrogen is released by a reducing agent, such as sodium borohydride, and oxidized thus producing a negative charge on the surface of the part. The most common electroless plating methods are electroless nickel and copper platings, where the chemistry for each may vary significantly. In one embodiment, electroless copper deposition includes submersing a circuit precursor in a solution that includes copper ions, a reducing agent, a buffer to maintain a certain pH and a complexing agent. In general, method 100 may use any commercially available electroless deposition technique or apparatus. Metals that may be added via electroless plating include gold, silver, copper, nickel, rhodium, and palladium, for example. The exact chemistry and steps will vary with the type of metal.

Method 100 then adds a removable mask 16 over the conductive material according to a mask pattern (106). The mask pattern 16 may include a negative pattern of the final conductive line pattern 20, and forms an exposed pattern according to where subsequent plating or printing of conductive lines will occur (108). The negative pattern is a pattern that is substantially opposite to what the final conductive line pattern will be on the substrate. In essence, the areas not covered by the negative pattern will be the areas where plating or printing of the conductive lines will occur.

Mask 16 is removable. This implies the use of a material that permits removal. In one embodiment, mask 16 includes any masking agent, resin, polymer or material that dissolves in an organic solvent and is insoluble in water and copper plating solution. One suitable mask includes Elvacite™ 2046 dissolved in methyl ethyl ketone (MEK). In another embodiment, mask 16 may dissolve in an aqueous solution.

In one embodiment, a printing process adds the removable mask 16. For example, various printing technologies such as conventional inkjet printers may be used to pattern the removable mask ink at desired locations on a flat or non-flat substrate. These may include any of the following printing technologies: ink-jet printing, screen printing, pad-printing, Gravure printing, a stencil, rotogravure, flexographic techniques, brush coating, or various other blank coating techniques. Resolution of the mask pattern then relates to the spatial resolution of the printing technology used to dispense the mask ink. Various printable mask inks and printing devices are described in further detail below.

Conductive lines 18 are then added according to the exposed pattern left open by mask 16 (108). A wide variety of conductive line formation techniques may be used. In general, step 108 may use any manufacturing technique that plates conductive lines on a surface that already includes a metal.

One suitable metallizing technique includes electroplating that adds more copper on top of the exposed electroless copper 14, to produce thicker copper lines in the exposed areas of copper 14 not covered by mask 16. Electroplating deposits additional metal used in the conductive lines. Electroplating is the process by which a metal in its ionic form is supplied with electrons to form a non-ionic coating on a desired substrate. One common electroplating system involves a chemical solution which contains the ionic form of the metal, an anode (positively charged) which may consist of the metal being plated (a soluble anode) or an insoluble anode (such as carbon, platinum, titanium, lead, steel, and the like), and finally, a cathode (negatively charged) where electrons are supplied to produce a film of non-ionic metal. Electroplating may include a full panel plating, which adds about 0.001 inch on the surface, or a "flash" panel plating, designed only to add small amounts of copper. Flash-plated panels return to copper electroplating to be plated up to a required thickness.

The conductive line formation techniques described herein are not intended to be limiting as there are many other manufacturing techniques for creating conductive lines on a surface, that already includes a metal, may be used.

Conductive material is added in step 108 to achieve a desired thickness for the conductive lines 20 when processing is complete.

The mask is then removed (110). The removal technique will depend on the mask material, as described above. In one embodiment, the mask is dissolved back using an organic solvent. In another embodiment, the mask is dissolved using an aqueous solution, such as water.

In a specific embodiment, the mask material is reusable and method 100 recycles the removed mask material. The mask material may be extracted from the solvent by any known methods. Thus, both the mask material and solvent may be recycled and reused thereby reducing waste and costs.

If a blank process was used to add conductive layer 14 without a pattern, then method 100 proceeds with removing a thin layer of conductive material (112). This removes conductive layer 14, and exposes negative portions 22 of substrate 10, in surface area locations previously covered by mask 16. Typically, the thickness of layer 14 is thinner than the thickness of conductive lines 18, so the removal does not take significant material from conductive lines 18 to affect their ability to function as conductive lines.

Brief treatment with etchant is suitable to remove the base layer 14 of metal. This also removes a thin layer of material from conductive lines 18, which may produce a cross-sectional profile of conductive lines 18 that distinguishes method 100. For example, the corners of conductive lines 18 may be rounded from the etch. This is a contrast to the cross-sectional profile of conductive lines formed in the subtractive process discussed above, where sidewall dimensions are inward bowed from the lateral etching of copper between the lines. One of skill in the art is aware of the micro-cross-sectional profiles of conductive lines formed in the subtractive process.

The pattern includes a set of conductive lines 20 that may or may not actually form a circuit. Other patterns may also include circles, rectangles, and sets of concentric circles or rectangles used for an antenna, for example. In general, the pattern is not intended to be limiting as the pattern may take any geometric arrangement.

Notably, method 100 builds conductive material where the final conductive pattern 20 is, as opposed to traditional techniques that deposit copper everywhere and remove most of the copper in areas where the final conductive pattern is not. In some cases, the subtractive copper patterning process removes up to between about 50-60% percent of the thick copper layer.

While some conductive material will be removed in the etch back in 112, method 100 removes significantly less copper than the subtractive method. In one specific example, only 2% of the copper in combined layers 14 and 18 was removed in etching step 112. Method 100 is thus predominately additive: about 95% additive and only etches minor amounts, less than about 5%, of copper. However, the amount of copper etched may vary according to the thickness of layer 14. This removes less material, results in less waste rendering it environmentally friendly, requires less conductive material initially, and reduces costs.

In a specific embodiment, method uses roll-to-roll and high-throughput processing for steps 102-112. Continuous throughput manufacturing permits high-volume production, and reduces the cost of individual circuits mass-produced in this manner.

Method 100 does not require a photoresist or ultraviolet exposure system nor does method 100 require as many chemical procedures as is needed for the subtractive process. Furthermore, the ability to reuse and recycle the mask material and solvent also saves cost and reduces waste.

A wide variety of substrate 10 materials are suitable for use. The choice of substrate is typically driven by a particular application. At a high level, the substrate may be conductive, semi conductive, or insulating. Thus, the dielectric constant of the material may be of any value. The substrate may be homogeneous or heterogeneous in terms of the material it is made from. As an example of a heterogeneous substrate, packaging for a semiconductor chip includes a dielectric substrate on which conductive vias are formed. Line traces defined by a palladium ink pattern may be patterned to connect one conductive via to another or a conductive via to an external lead or pin.

The substrate can be flat or topologically varying. An example of a non-flat substrate is the inner casing of a cell phone that has a convex and custom shape. As another example, pins on a connector may be printed with palladium ink. The connector may also include a custom or non-flat shape.

Also, the substrate may be rigid, flexible or semi rigid. There are multiple ways to characterize a flexible substrate, including elastic modulus and/or thickness. In one embodiment, a flexible substrate includes an elastic modulus less than about 1 Giga Pascal (GPa). In a more specific embodiment, a flexible substrate includes an elastic modulus less than about 100 MegaPascal (MPa). In one embodiment, a flexible substrate includes a thickness less than about 1 centimeter. In a more specific embodiment, the thickness is less about 1 mil. A higher modulus of elasticity and/or thickness may also be used.

One substrate of particular interest is polyimid. Polyimid (also sold as Kapton®) is commercially available in thin sheets, is suitable for printing using many printers such as commercially available ink jet printers, and is also suitable for circuit applications that include a flexible substrate. Polyimid also includes a robust thermal stability that can withstand dual-stage heating. Conventionally, adhesives are used to attach copper to polyimid. The adhesives remain in the finished circuit but do not survive elevated circuit temperatures and thus compromise the thermal stability of polyimid circuits (in addition to adding thickness as described above). The predominately additive method and system described herein, however, maintains thermal stability of circuits constructed with high temperature substrates such as polyimid, in a thinner profile.

Other exemplary substrates may include polyester, polypropylene, polyethylene, ceramic materials, or any other good dielectric material. The substrate onto which the palladium precursor is deposited, and subsequently a palladium layer and conductive lines formed, can also be a metallic material. Also, the substrate can be plastic, ceramic, glass, silicon wafer, cellulose, graphite, and paper substrates. Paper readily permits printing using commercially available and general-purpose printers. In general, substrate selection is driven by an application. Many rigid circuit board applications use silicon wafers and Fr-2 or Fr-4 substrates, and are suitable for use herein.

A variety of printable mask inks, printed masks, and printers for creating the patterned masks that are used in the manufacture of conductive line patterns and electronic circuits may be used. The examples described herein are for exemplary purposes only and are not intended to be limiting as other combinations, mixtures, solutions, devices, and the like may be used. The mask inks may be printed using screen printing or pad printing techniques for example; other printing techniques may also be used. In one embodiment, the printable inks are used in an additive manufacture process such as step 106 of method 100 in FIG. 1.

Traditionally, screen-printing has been used for decorative applications, such as tee-shirt printing, or for printing labels on bottles. Notably, the traditional screen printing inks were designed to permanently adhere to the shirt or bottle material.

The mask ink described herein, however, alters the usage and desired qualities of printing inks, such as screen printing inks, for their application as masks to manufacture conductive lines and electronic circuits. In one embodiment, and as described above with respect to 106 of FIG. 1, the printable inks and printed masks may be used to apply a negative pattern, wherein exposed portions provide a pattern for the conductive line formation.

Again, screen printing inks for tee-shirts and prior screen printing applications are designed to permanently adhere to the substrate, and employ heat, radiation or other techniques to cure the ink and increase adherence. By contrast, for an ink to act as a mask for patterning conductive lines, the printable mask ink is temporary and may be removed from the substrate after the conductive lines have been formed. The screen printing of masks allows for a simpler and less expensive method of producing electronic circuits. Screen printing of masks allows for more precise lines, good edge definition, and allows for the printing of flat and non-flat substrates.

In addition to the above property, a printable mask ink may also include one or more of these properties:
(1) a composition that allows the printable mask ink to be easily removed from a screen, or other printing apparatus components;
(2) electrically non-conducting;
(3) resistance to etching solutions and electroplating solutions if these manufacturing techniques are used to deposit the conductive line material;
(4) a rheology suitable for use with the printing apparatus used to apply the printable mask ink;
(5) low cost when high volume manufacturing is desired;
(6) pliable onto a variety of substrates; and
(7) easy to store and may be reused.

The printable mask ink may be adapted to a rheological property of a fluidic dispensing requirement of a printing apparatus. Rheological requirements for the printable mask ink may depend on the printing technology used to apply the ink. The rheological property may include one or more of: surface tension, density and viscosity (and combinations thereof) for the printable mask ink and/or a rheological fluidic dispensing requirement of a printer. For example, Gravure inks preferably include a low viscosity that allows them to be drawn into engraved cells in a cylinder and then transferred onto a substrate. Many inkjet printers tune the wave form supplied to their piezoelectric actuator according to rheological properties of their preferred ink, for example, for quality control of printed output. Inks with rheological properties that do not match the tuned waveform often produce lesser quality printed output. Providing a new or different ink, such as the printable mask ink, to a commercially available in general-purpose inkjet printer may then require the ink to conform to a tuned waveform or other printing apparatus rheological property.

There are multiple ways to adapt a printable mask ink to a rheological property of a fluidic dispensing requirement of a printer. In one example, the solvent may be selected to provide a particular aggregate rheological property for the printable mask ink. For example, the solvent may be chosen with particular surface tension, density or viscosity to match that desired by a particular printing apparatus.

In another example, the printable mask ink may also include an additive that adjusts a rheological property of the printable mask ink to a rheological property of a fluidic dispensing requirement of a printing apparatus. For example, the additive may include a surfactant that changes surface tension and/or density. Surface tension of the printable mask ink often affects droplet size for an inkjet printer that deposits the ink onto a substrate. The particular substrate material may also affect surface tension for the printer; paper often has a different droplet size then a smooth surface associated with a polymer such as polyimid. In either instance, the surfactant may be selected to achieve a desired droplet size for a particular inkjet printer and a particular substrate material. The additive may be selected to be chemically inert to the conductive line materials.

Figure 4A:
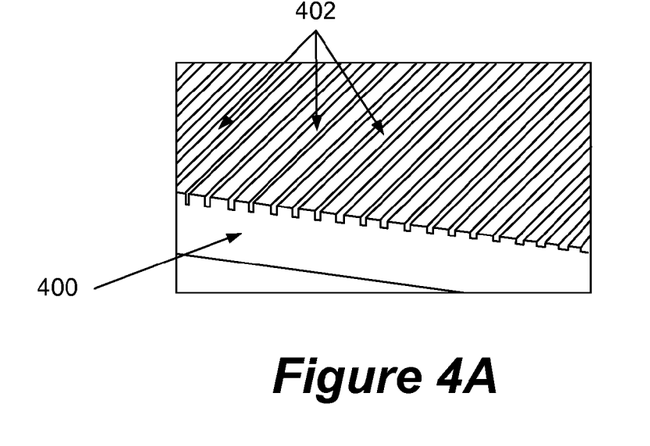
FIGS. 4A-4C illustrate exemplary line formations obtained from the method of FIG. 1.
Figure 4B:
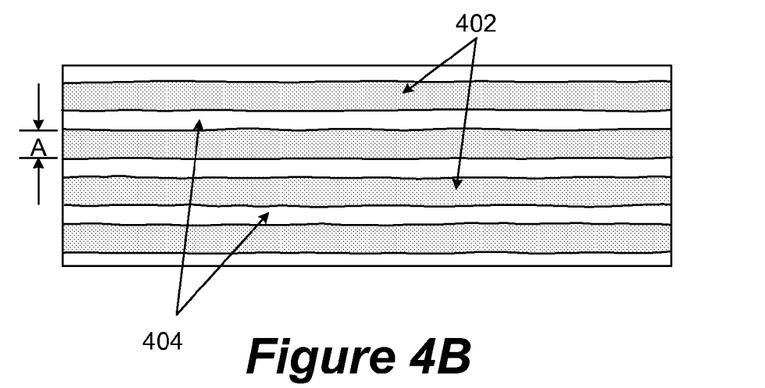
Figure 4C:
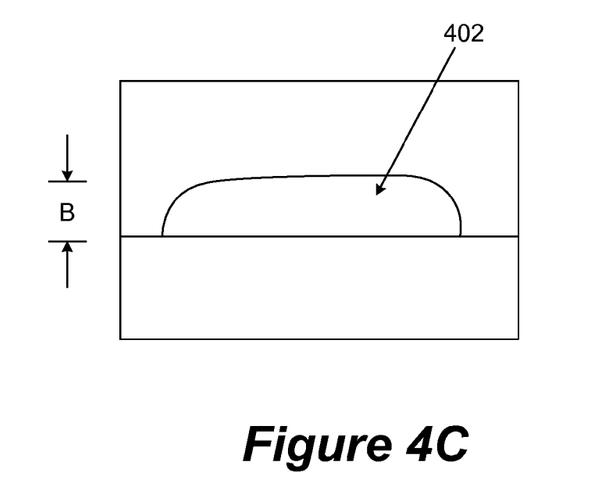
Figure 5:
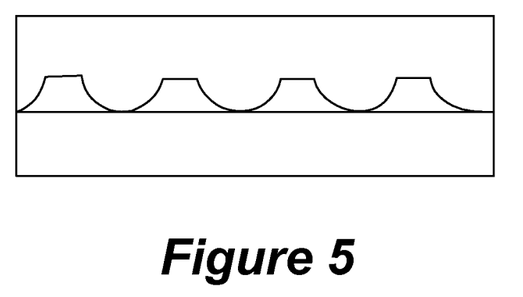
FIG. 5 is a cross-sectional diagram of traditional line formations.

FIGS. 4A-4C illustrate exemplary line formations obtained from the method 100 of FIG. 1. FIG. 4A illustrates a cross sectional view of lines 402 formed on a flexible circuit 400, FIG. 4B illustrates a top view of the lines 402 formed on the flexible circuit, and FIG. 4C illustrates a front view of a single line 402 formed on the flexible circuit. As illustrated, the definitions of the lines 402, illustrated as A, and space between the lines 404 may have a width as low as about 50 microns. As illustrated in FIG. 4C, the line may have a thickness B of about 7.4 microns. Additionally, the formed lines 402 are fully filled and have a rounded oval-like shape compared to traditional lines that are not fully filled and have a trapezoidal-like shape as illustrated in the cross-sectional diagram of FIG. 5.

Tables 1-3 illustrate examples of printable mask inks that meet all of the design properties listed above. These mask inks were able to produce fine line definitions, such as the lines illustrated in FIGS. 4A-4C. However, the examples are not intended to be limiting as other solutions, suspensions, and mixtures may be used.

TABLE 1

| Components | weight [%] |
|---|---|
| terpineol | 22.9% |
| cyclohexanone | 13.7% |
| Poly(butylmethacrylate-co-methyl methacrylate) | 22.9% |
| Elvacite 2046 | 2.8% |
| alumina 0.05 micron | 37.6% |
| Brij 76 | 0.10% |

TABLE 2

| Components | weight [%] |
|---|---|
| terpineol | 23.5% |
| cyclohexanone | 17.6% |
| Poly(butylmethacrylate-co-methyl methacrylate) | 20.4% |
| Elvacite 2046 | 7.1% |
| alumina 0.05 micron | 22.0% |
| Brij 76 | 0.2% |
| mineral oil | 1.0% |
| tar pitch | 3.3% |
| fumed silica 0.014 micron | 5.0% |

TABLE 3

| Components | weight [%] |
|---|---|
| octyl acetate | 32.0% |
| Poly(butylmethacrylate-co-methyl methacrylate) | 28.6% |

TABLE 3-continued

| Components | weight [%] |
|---|---|
| Elvacite 2046 | 3.5% |
| alumina 0.05 micron | 35.8% |
| Brij 76 | 0.1% |

Figure 3A:
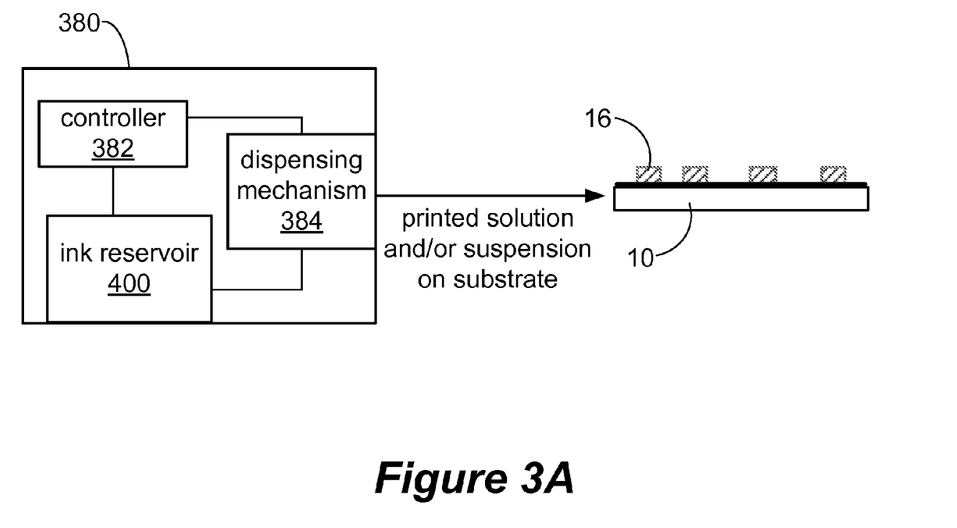
FIGS. 3A and 3B illustrate an exemplary printing apparatus.
Figure 3B:
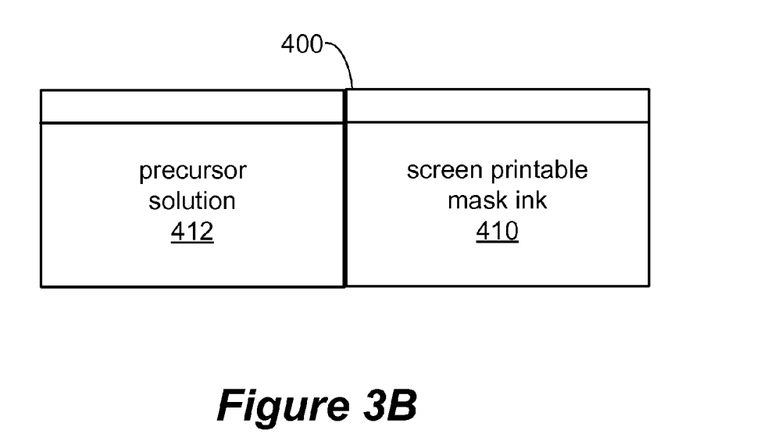

A variety of printing apparatuses may be used to provide the patterned mask that is used to define a pattern of conductive lines. As mentioned above, the printable mask inks are well suited for use with a screen printing apparatus or pad printing apparatus. FIGS. 3A and 3B illustrate an exemplary printing apparatus. Referring initially to FIG. 3A, printing apparatus 380 refers to a mechanized system that delivers a printable mask ink 410 onto a substrate 10 to form a mask 16. Printing apparatus 380 generally includes: controller 382, dispensing mechanism 384, and ink reservoir 400.

The exact structure of printing apparatus 380 and each of its components will vary with the printing technique employed. For example, there may be more than one ink reservoir 400 to store the precursor solution. In another example, the ink reservoir 400 may have two housings: one to store the precursor solution 412 and the other to store the mask ink 410. Indeed, the printing masks using inks described in this section may use a commercially available printing technique or apparatus without the need for special retooling or reconfiguration for printable mask ink 410. In other cases, printing apparatus 380 is specially manufactured and/or configured for printing circuits according to print inks described in this section.

The printing apparatus 380 may include a contact or contact-less printing technology, and/or signal-directed, manual or mechanical means. For example, printing apparatus 380 may employ any one, or a combination, of the following printing technologies: screen printing, ink-jet printing, pad-printing, spray coating, spin coating, puddle coating, dip coating, Gravure printing, ultrasonic spray techniques, wire coating, a stencil, rotogravure, flexographic techniques, brush coating, or various other blank coating techniques. Monochrome printing is suitable in many instances.

Dispensing mechanism 384 is configured to transfer the printable mask ink 410 from reservoir 400 to a substrate 10. The structure of dispensing mechanism 384 will depend on the printing technology used. For example, a conventional inkjet printer often includes a small printing tube with a known volumetric capacity that the palladium ink fills into. A control signal causes an actuator, such as a piezoelectric actuator, to squeeze the tube and dispense ink from the tube onto the substrate. For 2-D inkjet printing, a linear actuator moves the tube in a direction orthogonal to a direction of substrate feed, thereby providing 2-D printing onto a substrate. The tube then expands and contracts according to an applied waveform or control signal that matches a known position of the tube relative to a current position of the substrate. In this manner, any custom pattern may be disposed on a substrate according to a control signal that corresponds to the pattern.

In a specific embodiment, printing apparatus 380 includes a general-purpose printer. For example, this may include a printer traditionally used with personal computers and commercially available from a wide variety of vendors, including retail vendors and the like. One suitable personal printer is the Epson C66, available from a wide variety of vendors, reconfigured with an ink cartridge that includes mask ink as described herein. The general-purpose printer may also include any printer used in the printing industry, such as commercially available models used to print on banners and large sheets. One suitable larger printer is the Roland SP300V available from Roland DG Corporation of Hamamatsu, Japan. These general-purpose printers are generally configured to print on thin sheets made from substrates such as commercially available paper or polyimid. One suitable commercially available printer includes ink-jet printers. Printable mask ink 410 may then be stored in a printing cartridge 400 that mechanically interfaces with the general-purpose printer.

Printing apparatus 380 may also be configured to interact with a personal computer, which is used to supply printing patterns to printer 380. A user interface on the personal computer permits external control of printing on apparatus 380. The user interface also permits easy reconfiguration and printing of mask patterns and circuit designs—without special retooling of printing apparatus 380 for each new pattern or circuit. In this manner, new masks may be printed as readily as a conventional general-purpose printer produces new paper documents.

One suitable class of printing may be broadly characterized as "drop on demand" printing. In these processes, a drop of mask ink is created wherever necessary on a substrate as regulated by controller 382. Controller 382 may include any combination of a processor and/or memory suitable configured to output a signal to control dispensing mechanism 384. In one embodiment, the signal is digital and corresponds to a pattern for the mask. The pattern may be received from an external computer that controller 382 interfaces with. Controller 382 may include one or more commercially available processors that interact with a memory that stores instructions and information suitable for printing mask patterns on one or more substrates. The memory may include random-access memory (RAM), read-only memory (ROM), hard drive space, tempering memory such as a memory stick or CD-ROM, and the like.

Spatially controlled printers permit easy and fast circuit reconfiguration where only the control signal needs to be changed to produce a new circuit design or layout. Thus, the present invention contemplates circuit manufacture according to digital design without mechanical reconfiguration or downtime of a circuit manufacturing line. For example, some commercially available inkjet printers are suitable for mask patterns 16 on flexible polyimid substrates one or two at a time (or more, if desired).

Another class of printing may be broadly characterized as "image" printing. For example, Gravure printing may also be used for printing apparatus 380. As a dispensing mechanism 384, Gravure printing employs a depressed or sunken surface for the image that is etched or engraved into a cylinder; the unetched areas of the cylinder represent the non-image or unprinted areas. The cylinder rotates in a bath of ink called the ink pan (in this instance, reservoir 400 includes a Gravure ink pan that stores printable mask ink 410). As the cylinder turns, the excess ink is wiped off the cylinder by a doctor blade. The mask ink remaining on the cylinder forms a mask pattern by direct transfer to the substrate (paper, polyimid or other material) as it passes between a plate cylinder and an impression cylinder. Gravure printing is well suited for static image, long run, high quality printing that produces a sharp, fine image.

In another embodiment, printing apparatus 380 permits conformal printing. Conformal printing refers to printing mask ink 410 on non-flat and three-dimensional surfaces. For example, the non-flat surface may include the inner surface of a cell phone housing or other portable electronics device, which is commonly curved and custom shaped. In one embodiment, conformal printing apparatus 380 may be used in pad printing. Pad printing is a printing process that can transfer a 2-D image onto a 3-D object. This is accomplished using an indirect offset (or gravure) printing process that involves an image being transferred from the printing plate (also called a cliché) via a pad onto a substrate. Pad printing may be used for printing on otherwise impossible products in many industries including medical, automotive, promotional, apparel, electronics, appliances, sports equipment and toys. The pad may be a flexible silicon rubber pad able to pick up a film of ink from a printing plate and transfer it to the 3-D substrate. The unique properties of silicone rubber allow distortion-free patterns to be applied to flat, curved, or tapered surfaces with good definition and opacity. Pad printing using the additive method described herein may allow for line definition up to about 150 microns.

In yet another embodiment, conformal printing apparatus 380 includes a pen, movable in three dimensions, that dispenses mask ink 410 in response to a control signal. Based on a known position of the controlled pen relative to the non-flat substrate, mask ink is released at controlled times and a pattern is then produced on the conformal surface as desired.

The conformal printing apparatus 380 may include any robotic system that tracks: a) the substrate (or part such as a cell phone housing); b) the dispensing mechanism 384; or c) combinations thereof, to provide 3-D relative motion between the substrate and dispensing mechanism 384. For example, dispensing mechanism 384 may include a 3-D robotic actuator that moves a pen or dispensing mechanism to the custom shape of a non-flat substrate.

Resolution of a printed mask pattern 16 (and subsequent conductive line resolution) will vary with the printing apparatus 380. In general, resolution may be limited to droplet size for the printing apparatus. In some cases, printing capabilities of the printing technology may be used to improve resolution and pattern output. For example, the dots or drops per inch used in an inkjet printer will affect droplet size and may be tailored to increase pattern resolution. In addition, for many conventional and general-purpose inkjet printers, a grayscale level setting changes the number of passes that the dispensing mechanism makes across a substrate. Decreasing the grayscale setting then decreases the number of passes that the dispensing mechanism makes, and thereby reduces the number of drops and quantity of mask ink onto the substrate.

The printable mask ink may be stored in a printing mask ink reservoir 410 as illustrated in FIG. 3B. The mask ink reservoir 410 may resemble a cartridge that mechanically interfaces with a general-purpose printer such as an off-the-shelf inkjet printer. Alternatively, the reservoir may physically resemble an ink well used in Gravure printing. Furthermore, the printable inks in reservoir 400 (FIG. 3A) are suitable with many of the substrates described above.

While embodiments and applications of this invention have been shown and described, it would be apparent to those skilled in the art having the benefit of this disclosure that many more modifications than mentioned above are possible without departing from the inventive concepts herein.

What is claimed is:

1. A method for forming conductive lines on a substrate, comprising:
   forming an active metal layer onto at least a portion of the substrate;
   depositing a thin layer of conductive material over the active layer;
   forming a negative-patterned ink mask over at least a portion of the thin layer of conductive material to form an exposed pattern;
   forming conductive lines in the exposed pattern;
   removing the negative-patterned ink mask by a non-etchant, thereby uncovering an exposed portion of the conductive layer that substantially corresponds to a negative pattern portion; and
   removing the exposed portion of the conductive layer so as to uncover substrate that substantially corresponds to the exposed portion.

2. The method of claim 1, wherein the thin layer of conductive material has a thickness of less than 4 micrometers.

3. The method of claim 1, wherein the thin layer of conductive material is a conductive seed layer having a thickness of between 0.025 and 2 micrometers.

4. The method of claim 1, wherein a thickness of the conductive lines is greater than a thickness of a thin layer of conductive material.

5. The method of claim 1, wherein the removing the negative-patterned mask further comprises dissolving the negative-patterned mask with an organic solvent or water.

6. The method of claim 5, further comprising:
   extracting the negative-patterned mask from the dissolved mask solution;
   recycling the negative-patterned mask; and
   recycling the organic solvent.

7. The method of claim 1, wherein the removing at least a portion of the exposed conductive layer further comprises etching at least a portion of the exposed conductive layer with an etchant.

8. The method of claim 1, wherein the substrate is flexible.

9. The method of claim 8, further including the step of:
   conducting the flexible substrate through a roll-to-roll throughput process while at least one of the other steps are performed.

10. The method of claim 9, wherein said conducting step is performed while all of the other steps are performed.

11. The method of claim 1, wherein said method results in the formation of conductive lines having a cross-section that is a rounded oval-like shape.

12. The method of claim 1, wherein said method results in the formation of conductive lines having corners that are rounded.

13. The method of claim 1, wherein said method results in the formation of conductive lines having a cross-sectional shape that includes no exposed sharp edges.

14. A method of forming conductive lines on a flexible substrate, comprising:
   forming an active metal layer onto at least a portion of the flexible substrate;
   depositing a thin layer of conductive material over the active layer;
   screen printing a negative-patterned ink mask over at least a portion of the thin layer of conductive material to form an exposed pattern;
   forming conductive lines in the exposed pattern;
   removing the negative-patterned ink mask by a non-etchant, thereby uncovering an exposed portion of the conductive layer that substantially corresponds to a negative pattern portion;
   removing the exposed portion of the conductive layer so as to uncover substrate that substantially corresponds to the exposed portion; and
   conducting the flexible substrate through a roll-to-roll throughput process while at least all of the other steps are performed.

15. The method of claim 14, wherein said method results in the formation of conductive lines having corners that are rounded.

16. A method of forming conductive lines on a substrate, comprising:
- forming an active metal layer onto at least a portion of the substrate;
- forming a layer of conductive material over the active layer;
- forming a negative-patterned mask over at least a portion of the thin layer of conductive material to form an exposed pattern;
- forming conductive lines in the exposed pattern;
- removing the negative-patterned mask, thereby uncovering an exposed portion of the conductive layer that substantially corresponds to a negative pattern portion; and
- removing the exposed portion of the conductive layer so as to uncover substrate that substantially corresponds to the exposed portion, wherein the resulting conductive lines have a cross-section that is a rounded oval-like shape.

17. The method of claim 16, wherein the substrate is flexible.

18. The method of claim 17, further including the step of:
- conducting the flexible substrate through a roll-to-roll throughput process while at least one of the other steps are performed.

19. The method of claim 18, wherein said conducting step is performed while all of the other steps are performed.

* * * * *